United States Patent
Shin et al.

(10) Patent No.: US 9,553,342 B2
(45) Date of Patent: Jan. 24, 2017

(54) BATTERY PACK

(71) Applicant: Samsung SDI Co., Ltd., Yongin-si, Gyeonggi-do (KR)

(72) Inventors: Kyungjae Shin, Yongin-si (KR); Kiwoong Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 654 days.

(21) Appl. No.: 14/012,980

(22) Filed: Aug. 28, 2013

(65) Prior Publication Data

US 2014/0342191 A1 Nov. 20, 2014

Related U.S. Application Data

(60) Provisional application No. 61/824,225, filed on May 16, 2013.

(51) Int. Cl.
| | |
|---|---|
| *H01M 10/48* | (2006.01) |
| *H01M 10/42* | (2006.01) |
| *H02J 7/00* | (2006.01) |
| *H02J 7/04* | (2006.01) |
| *H05K 1/02* | (2006.01) |
| *G06F 1/26* | (2006.01) |
| *G06F 1/16* | (2006.01) |
| *H05K 1/14* | (2006.01) |
| *H05K 1/18* | (2006.01) |
| *H01M 2/10* | (2006.01) |

(52) U.S. Cl.
CPC ........ *H01M 10/4257* (2013.01); *G06F 1/1635* (2013.01); *G06F 1/26* (2013.01); *H01M 10/486* (2013.01); *H02J 7/0091* (2013.01); *H02J 7/047* (2013.01); *H05K 1/0201* (2013.01); *H01M 2/1022* (2013.01); *H01M 10/4207* (2013.01); *H01M 10/48* (2013.01); *H01M 2200/105* (2013.01); *H01M 2200/106* (2013.01); *H01M 2220/30* (2013.01); *H05K 1/147* (2013.01); *H05K 1/189* (2013.01); *H05K 2201/10037* (2013.01); *H05K 2201/10151* (2013.01)

(58) Field of Classification Search
None
See application file for complete search history.

(56) References Cited

U.S. PATENT DOCUMENTS

| | | |
|---|---|---|
| 2006/0071637 A1 | 4/2006 | Heo et al. |
| 2009/0109099 A1 | 4/2009 | Jang et al. |
| 2009/0154048 A1 | 6/2009 | Jang et al. |

(Continued)

FOREIGN PATENT DOCUMENTS

| | | |
|---|---|---|
| KR | 10-2006-0027272 A | 3/2006 |
| KR | 10-2012-0021393 A | 3/2012 |
| KR | 10-2012-0054338 A | 5/2012 |

OTHER PUBLICATIONS

EPO Extended Search Report dated Aug. 18, 2016, for corresponding European Patent Application No. 13192067.0 (7 pages).

*Primary Examiner* — Tracy Dove (74) *Attorney, Agent, or Firm* — Lewis Roca Rothgerber Christie LLP (57) ABSTRACT

A battery pack includes a plurality of battery cells; a case accommodating the battery cells; a protective circuit module comprising a circuit board adjacent to the battery cells; a temperature sensitive element on the protective circuit module; and a flexible printed circuit board comprising a conductive pattern layer, wherein the conductive pattern layer is thermally connected to the temperature sensitive element.

20 Claims, 4 Drawing Sheets

(56) References Cited

U.S. PATENT DOCUMENTS

2011/0210703 A1  9/2011  Souza et al.
2011/0268996 A1  11/2011  Lee
2012/0028083 A1  2/2012  Jung
2012/0127682 A1  5/2012  Jang
2012/0276419 A1  11/2012  Park

BATTERY PACK

CROSS-REFERENCE TO RELATED APPLICATION

This application claims priority to and the benefit of U.S. Provisional Application No. 61/824,225, filed on May 16, 2013 in the U.S. Patent and Trademark Office, the entire content of which is incorporated herein by reference

FIELD

Aspects of the present invention relate to a battery pack, which can simplify a manufacturing process and can reduce fails.

BACKGROUND

In consideration of stability, the battery pack including a plurality of battery cells includes a protective circuit module. The protective circuit module used in the battery pack is configured such that a printed circuit pattern is formed on an insulating substrate and a plurality of semiconductor devices and a protection circuit are attached to the printed circuit pattern. In addition, in order to sense temperatures of the battery cells, a thermistor attached to each of the battery cells is electrically connected to the protective circuit module to transmit a signal indicating the measured temperature is transmitted to the protective circuit module, thereby protecting the battery cells from over-charge or over-discharge. However, the process of electrically connecting the thermistor to the protective circuit module may increase complexity in the overall process. When the thermistor is connected to the protective circuit module, connection failure may undesirably occur. In addition, the thermistor may be broken with use of the battery pack.

SUMMARY

Aspects of the present invention provide a battery pack, which can simplify a manufacturing process and can reduce fails.

At least one of the above and other features and advantages may be realized by providing a battery pack including one or more battery cells; a protective circuit module provided at one side of the battery cells; a temperature sensitive element formed in the protective circuit module; and a flexible printed circuit board connected between the battery cells and the protective circuit module, wherein a wiring pattern of the flexible printed circuit board is thermally connected to the temperature sensitive element.

Here, thermal grease or thermal silicon may be formed between the wiring pattern of the flexible printed circuit board and the temperature sensitive element.

In addition, the wiring pattern of the flexible printed circuit board and the temperature sensitive element are connected to each other through a thermally conductive pattern.

In the wiring pattern of the flexible printed circuit board, a sensing pattern may be provided to transfer the heat generated from the battery cells to the temperature sensitive element.

In addition, an insulating layer is removed from contact regions between the sensing pattern, and the battery cells and the contact regions may be exposed.

In addition, a dummy pattern electrically independent of the wiring pattern of the flexible printed circuit board may be provided to transfer the heat generated from the battery cells to the temperature sensitive element.

The temperature sensitive element may be provided as one of a positive temperature coefficient (PTC) thermistor and a negative temperature coefficient (NTC) thermistor.

In the battery pack according to the present invention, conductive tabs of the battery cells and the protective circuit module are connected to the flexible printed circuit board to transfer the heat generated from the battery cells to the temperature sensitive element on the protective circuit module through wiring patterns of the flexible printed circuit board, thereby reducing the number of processes for forming the temperature sensitive element and achieving a stable connection between the temperature sensitive element and the battery cells, irrespective of movement of the battery cells.

In addition, in the battery pack according to the present invention, sensing lines of the flexible printed circuit board are partially exposed, or a separate dummy pattern is formed in the flexible printed circuit board to then be partially exposed. Therefore, the exposed region is brought into direct contact with the battery cells and the heat generated from the battery cells is transferred to the temperature sensitive element without a loss, thereby achieving accurate temperature measurement.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
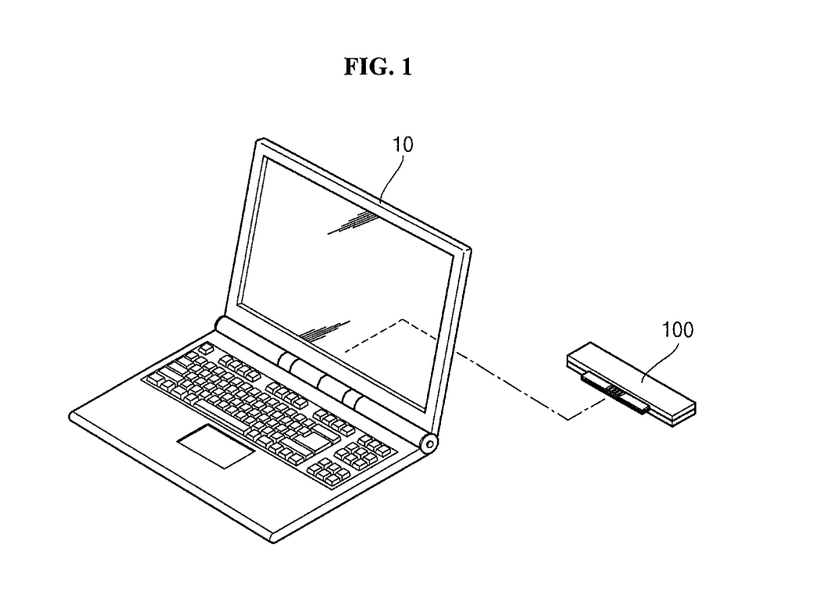
FIG. 1 is a perspective view of a battery pack according to an embodiment of the present invention coupled to an external device.
Figure 2:
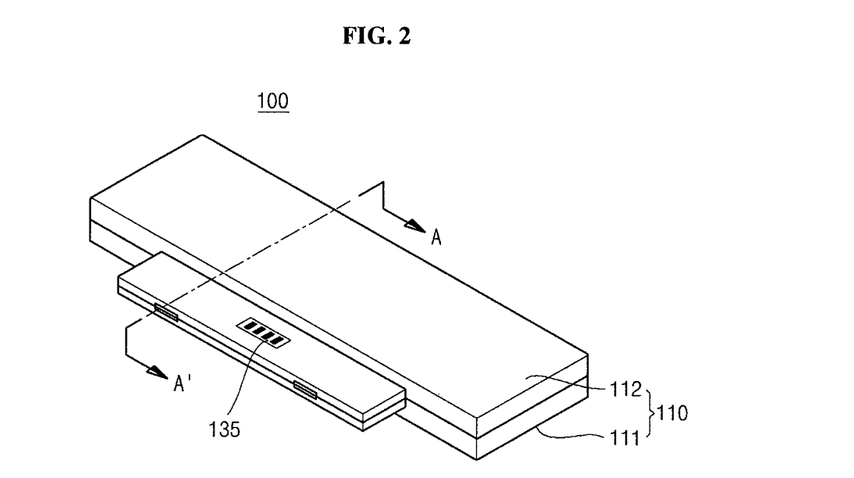
FIG. 2 is a perspective view of a battery pack according to an embodiment of the present invention.
Figure 3:
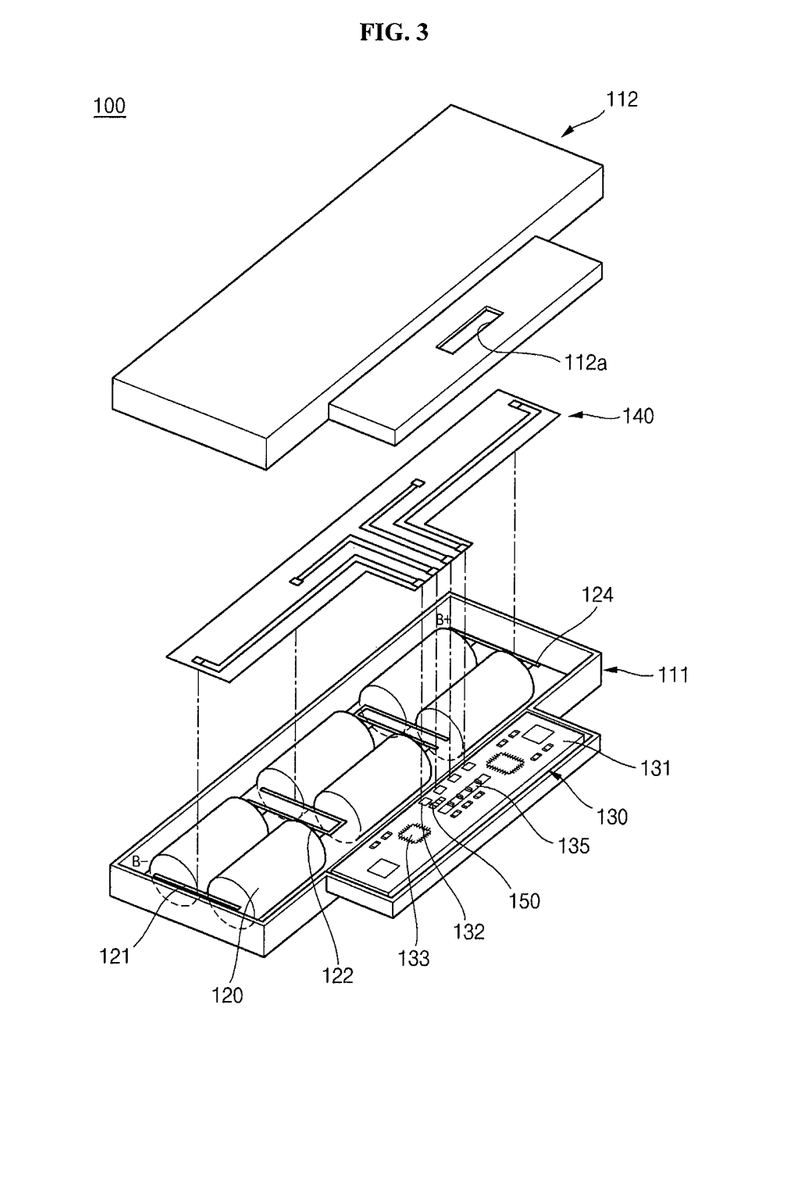
FIG. 3 is an exploded perspective view of a battery pack according to an embodiment of the present invention.
Figure 4:
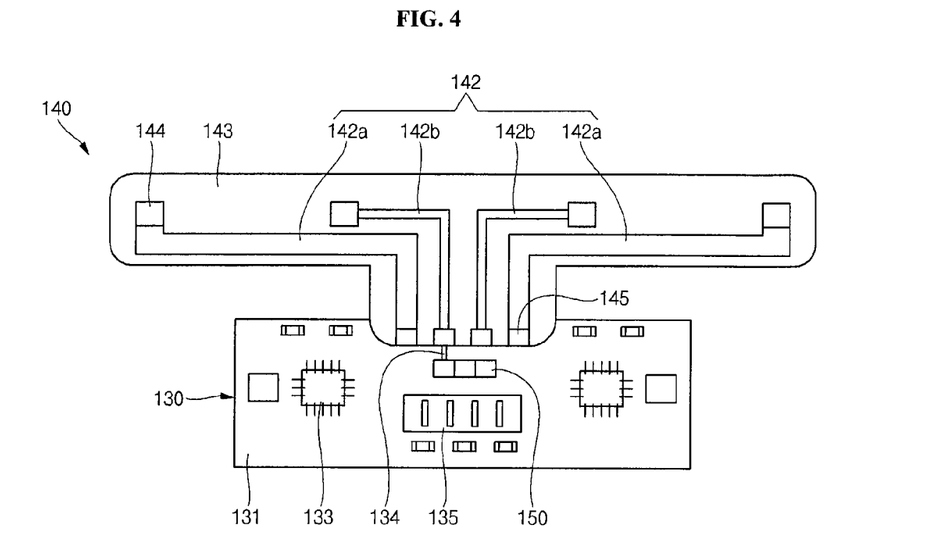
FIG. 4 is a plan view illustrating a connection relationship between a flexible circuit board and a protective circuit board in a battery pack according to an embodiment of the present invention.
Figure 5:
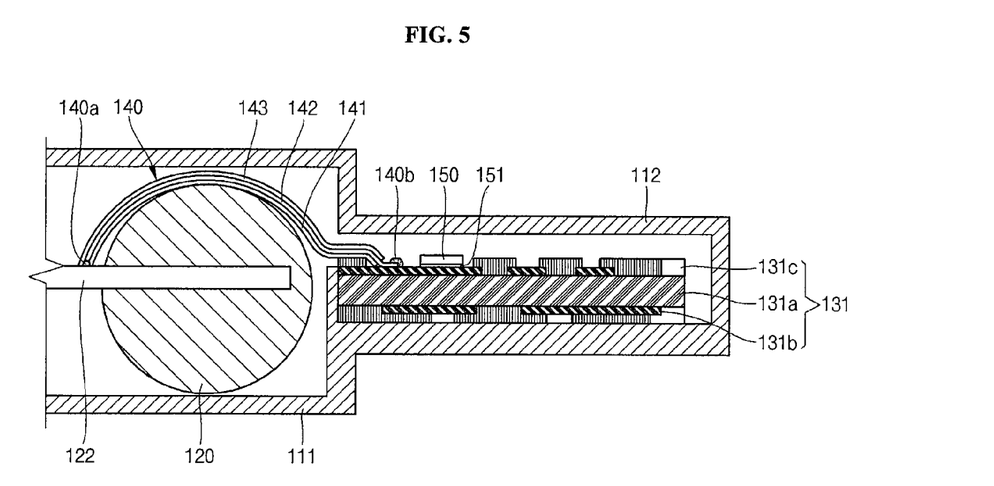
FIG. 5 is a cross-sectional view taken along the line A-A' of FIG. 2.

FIG. 1 is a perspective view of a battery pack according to an embodiment of the present invention coupled to an external device, FIG. 2 is a perspective view of a battery pack according to an embodiment of the present invention, FIG. 3 is an exploded perspective view of a battery pack according to an embodiment of the present invention, FIG. 4 is a plan view illustrating a connection relationship between a flexible circuit board and a protective circuit board in a battery pack according to an embodiment of the present invention, and FIG. 5 is a cross-sectional view taken along the line A-A' of FIG. 2.

Referring to FIG. 1, the battery pack 100 according to the embodiment of the present invention is coupled to an external device, such as a notebook computer 10, to be used as a power source. While the battery pack 100 coupled to the notebook 10, for example, is illustrated in FIG. 1, it can be used in various kinds of devices, such as mobile phones or cameras, and a plurality of battery cells may be provided in the battery pack 100.

Referring to FIGS. 2 and 3, the battery pack 100 includes a case 110 consisting of an upper case 111 and a lower case 112, a plurality of battery cells 120 provided in the case 110, a protective circuit module 130 electrically connected to the battery cells 120, a flexible printed circuit board 140 connecting the battery cells 120 and the protective circuit module 130, and a temperature sensitive element 150 provided in the protective circuit module 130.

The case 110 accommodates the battery cells 120, the protective circuit module 130 and the flexible printed circuit board 140. The case 110 may include the lower case 111 and the upper case 112 coupled to each other.

The lower case 111 is shaped as a box having an open top end surface to receive the battery cells 120, and includes a protruding part further formed at one side of the lower case 111 to receive the protective circuit module 130.

The upper case 112 is coupled to an upper portion of the lower case 111. The upper case 112 is formed to correspond to the lower case 111, and a protruding part is also formed at one side of the upper case 112. The upper case 112 is coupled to the lower case 111, forming an external appearance of the battery pack 100.

The battery cells 120 are accommodated in the case 110. Rechargeable secondary batteries may be used as the battery cells 120. In the illustrated embodiment, the battery cells 120 are cylindrical batteries, but prismatic batteries may also be used according to the necessity. In addition, 6 battery cells 120 are exemplified. However, the present invention does not limit the number of battery cells and an appropriate number of battery cells may be provided according to the type of external device.

The battery cells 120 may have different polarities at top and bottom surfaces thereof. The top surfaces of the battery cells 120 may be electrically connected to a positive electrode of an electrode assembly in the cell, and the bottom surfaces of the battery cells 120 may be electrically connected to a negative electrode of the electrode assembly. In FIG. 3, reference symbols B+ and B− indicate high current terminals, corresponding to power supply units at opposite ends of the battery cells 120 connected to each other in series/parallel.

In addition, conductive tabs 121 may be connected between the battery cells 120. The conductive tabs 121 connect positive electrodes and negative electrodes of the battery cells 120 laterally adjacent to each other to establish parallel connections between the battery cells 120. In addition, the conductive tabs 121 are positioned between the battery cells 120 vertically adjacent to each other to establish serial connections between the battery cells 120. The conductive tabs 121 may be made of nickel (Ni), copper (Cu), aluminum (Al) and equivalents thereof, but aspects of the present invention are not limited thereto. In addition, each of the conductive tabs 121 is substantially 'U' shaped so that the battery cells 120 are stably connected using elasticity, but aspects of the present invention are not limited thereto. However, the conductive tabs 121 may be simply plate-shaped.

The protective circuit module 130 is located next to the battery cells 120 to be installed to correspond to the case 110. In other words, a bottom surface of the protective circuit module 130 is positioned to face the lower case 111 of the case 110 and a top surface of the protective circuit module 130 is positioned to face the upper case 112. The protective circuit module 130 is electrically connected to the battery cells 110 to control charging and discharging of the battery cells 110 and preventing the battery cells 110 from being over-charged or over-discharged.

The protective circuit module 130 is formed around the circuit board 131, and a connection terminal 132 and at least one semiconductor device 133 are formed on one surface of the circuit board 131 to be connected to an external device through the connector 135.

The circuit board 131 includes a wiring pattern 131b formed on at least one surface of a planar insulating layer 131a and an insulation pattern 131c formed to surround a portion of the wiring pattern 131b. Here, the insulating layer 131a may be made of an insulating material, such as epoxy. In addition, the wiring pattern 131b may be made of an electrically conductive material, such as copper (Cu), titanium (Ti), nickel (Ni), or palladium (Pd), and the insulation pattern 131c may be made of an electrically insulating material, such as polyimide (PI) or polyethylene (PET) and may be formed on one surface of the insulating layer 131a by, for example, printing. However, the present invention does not limit materials of the wiring pattern 131b and the insulation pattern 131c to those listed herein.

The connection terminal 132 may be formed by exposing a portion of the wiring pattern 131b or by further providing a conductive material, such as gold (Au), on the exposed portion of the wiring pattern 131b. The connection terminal 132 includes four connection terminals and may be connected to terminals of the flexible printed circuit board 140. The connection terminal 132 controls charging and discharging of the battery cells 120 through the flexible printed circuit board 140 under the control of the semiconductor device 133.

The semiconductor device 133 includes at least one semiconductor device formed on one surface of the circuit board 131 and applies signals for controlling operations of the battery cells 120. The semiconductor device 133 controls charging or discharging extents through high current lines of the battery cells 120. In addition, the semiconductor device 133 applies signals indicating voltages, current and temperatures of the battery cells 120 to prevent over-charge or over-discharge. To this end, the semiconductor device 133 applies information about the voltages and currents of the battery cells 120 from the flexible printed circuit board 140 through the connection terminal 132 and applies information about the temperatures of the battery cells 120 from the temperature sensitive element 150, and controls the operations of the battery cells 120. Here, the information about the voltages, currents and temperatures may be transferred to the semiconductor device 133 through the wiring pattern 131b of the circuit board 130.

In particular, the circuit board 131 includes a thermally conductive pattern 134 separately provided on one surface of the circuit board 131 and may transfer heat of the battery cells 120 to the temperature sensitive element 150. Like the wiring pattern 131b of the circuit board 131, the thermally conductive pattern 134 may be made of a material, such as copper (Cu), gold (Au), titanium (Ti), nickel (Ni), or palladium (Pd). The thermally conductive pattern 134 is connected to the flexible printed circuit board 140 and may transfer the heat from the battery cells 120 to the temperature sensitive element 150. Therefore, the temperature sensitive element 150, formed in the protective circuit module 130, can accurately measure temperatures of the battery cells 120 even when it is not in direct contact with the battery cells 120. In one embodiment, when the temperature sensitive element 150 comes into direct contact with the flexible printed circuit board 140, the thermally conductive pattern 134 is not separately provided.

The flexible printed circuit board 140 is connected between the battery cells 120 and the protective circuit module 130. Since the flexible printed circuit board 140 is free from a bending operation, a stable connection may be maintained between the battery cells 120 and the protective circuit module 130 even if the battery cells 120 or the protective circuit module 130 move within the case 110.

The flexible printed circuit board 140 includes a first insulation layer 141, a conductive pattern layer 142, and a second insulation layer 143. In addition, the flexible printed circuit board 140 may further include a first connection terminal 144 and a second connection terminal 145 formed at opposite ends of the conductive pattern layer 142. Specifically, the first connection terminal 144 is exposed to exterior portions of the insulation layers 141 and 143 to be connected to the conductive tabs 121 of the battery cells 120. Here, the first connection terminal 144 and the conductive tabs 121 may be connected through a solder 140a, as shown in FIG. 5, or through a separate connector according to the option selected by one skilled in the art. In addition, the second connection terminal 145 is also exposed to exterior portions of the insulation layers 141 and 143 to be connected to the connection terminal 132 of the protective circuit module 130. Like in the first connection terminal 144, the second connection terminal 145 and the connection terminal 132 of the protective circuit module 130 may be connected through a solder 140b or a separate connector.

The first insulation layer 141 and the second insulation layer 143 may be formed as an insulating film made of, for example polyimide (PI) or polyethylene (PET).

In addition, the conductive pattern layer 142 may be made of an electrically conductive material, such as copper (Cu), gold (Au), titanium (Ti), nickel (Ni), or palladium (Pd) and may be formed on a top surface of the first insulation layer 141 to then be covered by the second insulation layer 143, thereby maintaining an electrically insulating state. The conductive pattern layer 142 may include a pair of high current lines 142a formed at the input/output terminals of the battery cells 120 and having relatively large widths, and a pair of sensing lines 142b connected between the battery cells 120 and having relatively small widths.

The high current lines 142a are connected to the protective circuit module 130 and may provide paths for applying charging/discharging currents of all of the battery cells 120. In addition, the high current lines 142a connected to the battery cells 120 may sense voltage and current signals of all of the battery cells 120 and may provide paths for transferring the sensed voltage and current signals to the protective circuit module 130.

The sensing lines 142b are connected to the conductive tabs 121 of the battery cells 120, except for the conductive tab 121 positioned at edge portions. The sensing lines 142b transmit voltage signals from connected portions of the battery cells 120 to the protective circuit module 130, thereby allowing the protective circuit module 130 to identify voltage values of the battery cells 120 connected in series. In one embodiment, the parallel-connected battery cells 120 are connected through the same conductive tabs 121 may have the same voltage value.

In addition, at least one of the sensing lines 142b may come into close contact with the battery cells 120. Therefore, the sensing lines 142b may be used as thermal conductors for the battery cells 120. In one embodiment, while the first insulation layer 141 is positioned between the sensing lines 142b and the battery cells 120, the sensing lines 142b may come into close contact with the battery cells 120 because the first insulation layer 141 has a relatively small thickness, and since the sensing lines 142b are good thermal conductors, the heat generated from the battery cells 120 may be transferred to the sensing lines 142b without a loss.

Once the heat from the battery cells 120 is transferred to the sensing lines 142b, the heat may be sequentially transferred to the second connection terminal 145 of the flexible printed circuit board 140 and the connection terminal 132 of the protective circuit module 130. In addition, the heat may be transferred from the connection terminal 132 to one end of the temperature sensitive element 150 through the thermally conductive pattern 134. Therefore, the heat from the battery cells 120 is sequentially transferred to the temperature sensitive element 150, the temperature sensitive element 150 may measure temperatures of the battery cells 120 even if it is physically separated from the battery cells 120. In addition, since the temperature sensitive element 150 is formed in the circuit board 131 of the protective circuit module 130 and is connected to the battery cells 120 through the flexible printed circuit board 140, movement of the battery cells 120 is dampened by the flexible printed circuit board 140, so that the temperature sensitive element 150 and the circuit board 131 may be maintained at a stably connected state.

In one embodiment, the high current lines 142a, instead of the sensing lines 142b, may be configured to function as thermal conductors for the battery cells 120, thereby transferring the heat to the temperature sensitive element 150. However, since the high current lines 142a have larger widths than the sensing lines 142b, a heat loss may be generated. Thus, the sensing lines 142b may be used as thermal conductors.

The temperature sensitive element 150 is provided on one surface of the circuit board 131 of the protective circuit module 130. The temperature sensitive element 150 is connected to the flexible printed circuit board 140 through the thermally conductive pattern 134, thereby measuring the temperatures of the battery cells 120.

The temperature sensitive element 150 may be a negative temperature coefficient (NTC) thermistor, the electrical resistance value of which decreases due to a negative temperature coefficient as the temperature of the battery cells 120 increases, or a positive temperature coefficient (PTC) thermistor, the electrical resistance value of which increases as the temperature of the battery cells 120 increases. Since the temperature sensitive element 150 sensitively reacts to temperature and alters resistance values with temperature, the protective circuit module 130 may control charging and discharging of the battery cells 120.

Specifically, the temperature sensitive element 150 is provided as a chip thermistor and may be coupled to the protective circuit module 130. Since the chip thermistor is simply connected to the circuit board 131 of the protective circuit module 130 by a solder mounting process of mounting a solder 151, the number of overall process steps can be reduced. In addition, the solder mounting can be automated, and a zig for fixing the protective circuit module 130 is not separately required, thereby simplifying the manufacturing process.

In addition, the temperature sensitive element 150 may also be directly connected to the second connection terminal 145 connected to the sensing lines 142b of the flexible printed circuit board 130 through thermal grease or thermal silicon without passing through the thermally conductive pattern 134 of the protective circuit module 130. Accordingly, since the thermally conductive pattern 134 is not provided, a simplified heat transfer path can be formed, thereby achieving accurate measurement.

Hereinafter, a configuration of a battery pack according to another embodiment of the present invention will be described.

Figure 6:
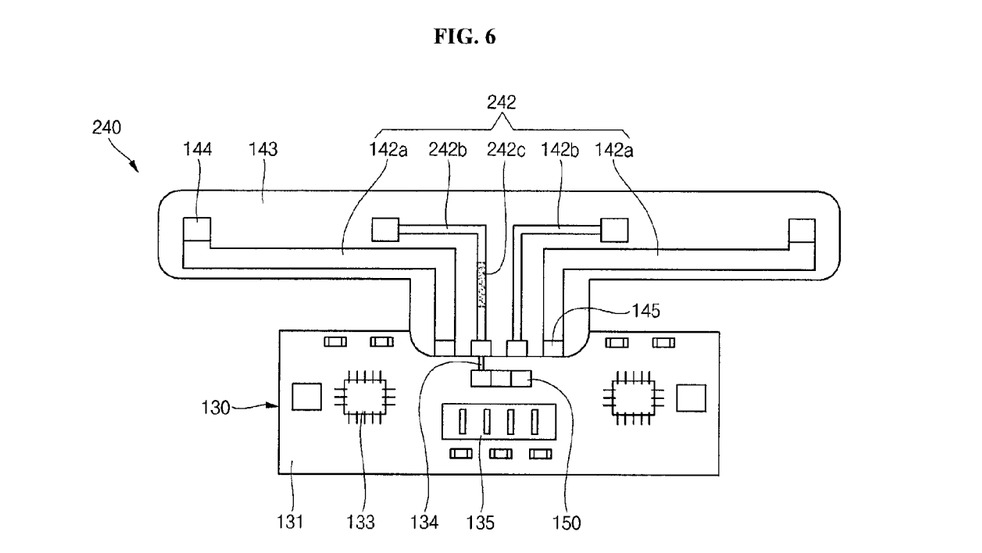
FIG. 6 is a plan view illustrating a connection relationship between a flexible circuit board and a protective circuit board in a battery pack according to another embodiment of the present invention.

FIG. 6 is a plan view illustrating a connection relationship between a flexible circuit board and a protective circuit board in a battery pack according to another embodiment of the present invention. Here, the same structural and functional components as those of the previous embodiment are denoted by the same reference numerals, and the following description will focus on differences between the present and previous embodiments.

Referring to FIG. 6, in the battery pack according to another embodiment of the present invention, a conductive pattern layer 242 of a flexible printed circuit board 240 includes a pair of sensing lines 242b. Here, at least one of the sensing lines 242b includes an exposed region 242c formed by removing a portion of the first insulation layer 141 and exposed to a bottom surface of the flexible printed circuit board 240. In addition, the exposed region 242c is provided to make direct contact with the battery cells 120. In addition, thermal grease or thermal silicon may further be formed between the flexible printed circuit board 240 and the exposed region 242c according to the option selected by one skilled in the art. Therefore, the sensing lines 242b may apply the heat from the battery cells 120 without a loss, thereby allowing the temperature sensitive element 150 connected to the sensing lines 242b to measure the temperatures of the battery cells 120 more accurately.

Hereinafter, a configuration of a battery pack according to still another embodiment of the present invention will be described.

Figure 7:
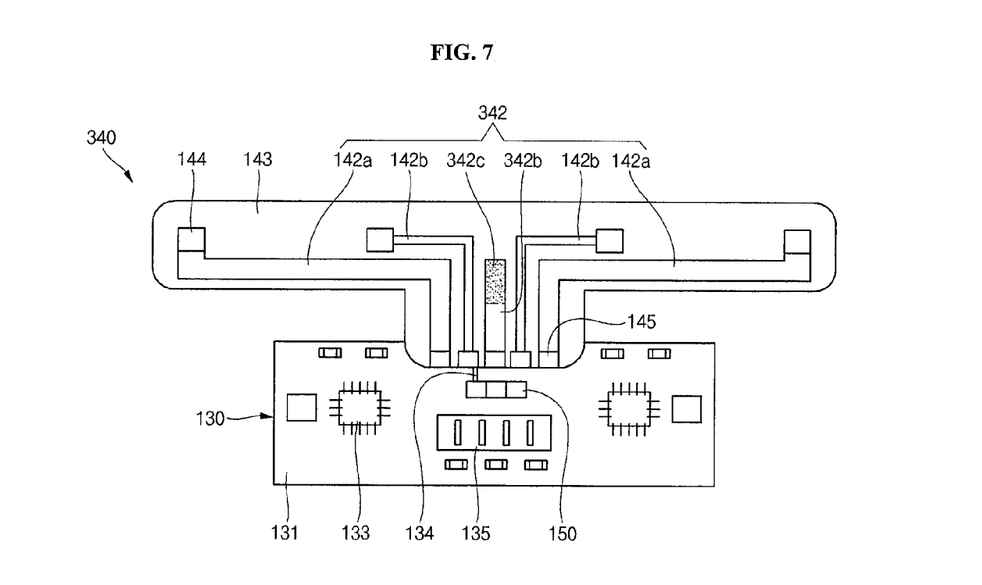
FIG. 7 is a plan view illustrating a connection relationship between a flexible circuit board and a protective circuit board in a battery pack according to still another embodiment of the present invention.

FIG. 7 is a plan view illustrating a connection relationship between a flexible circuit board and a protective circuit board in a battery pack according to still another embodiment of the present invention.

Referring to FIG. 7, in the battery pack according to still another embodiment of the present invention, a conductive pattern layer 342 of a flexible printed circuit board 340 includes high current lines 142a, sensing lines 142b, and a dummy line 342b formed independent of the high current lines 142a and sensing lines 142b. The dummy line 342b may have the same width as the sensing lines 142b and is electrically independent from the battery cells 120 without being connected to a first connection terminal 144. In addition, the dummy line 342b may include an exposed region 342c formed by, for example, removing a portion of a first insulation layer 141. The exposed region 342c makes direct contact with the battery cells 120 and may apply the heat directly from the battery cells 120. In addition, thermal grease or thermal silicon having good thermal conductivity may further be formed in the exposed region 342c, thereby more efficiently transferring the heat generated from the battery cells 120.

The dummy line 342b just applies the heat from the battery cells 120 without inputting/outputting electrical signals of the battery cells 120 and transfers the heat to the temperature sensitive element 150 through the second connection terminal 145. Therefore, since the heat is transferred through the dummy line 342b independent of the high current lines 142a and the sensing lines 142b, it is possible to reduce a heat loss, which may be generated in the course of transferring the heat through the electrical signals through the high current lines 142a and the sensing lines 142b or transferring the heat through the dummy line 342b.

While the battery pack according to the present invention has been particularly shown and described with reference to preferred embodiments thereof, it will be understood by those skilled in the art that various changes in form and details may be made therein without departing from the spirit and scope of the invention.

| DESCRIPTION OF THE SYMBOLS IN THE DRAWINGS | |
|---|---|
| 100: Battery Pack | 110: Case |
| 120: Battery Cells | 121: Conductive Tab |
| 130: Protective Circuit Module | 131: Circuit Board |
| 132: Connection terminal | 133: Semiconductor chip |
| 134: Thermal conductive pattern | 135: Connector |
| 140, 240, 340: Flexible Printed Circuit Board | |
| 141: First Insulation Layer | |
| 142: Conductive pattern layer | 142a: High current line |
| 142b, 242b: Sensing line | 342b: Dummy line |
| 242c, 342c: Exposed region | 143: Second insulation layer |
| 144: First connection terminal | |
| 145: Second connection terminal | |
| 150: Temperature Sensitive Element | |

What is claimed is:

1. A battery pack comprising:
   a plurality of battery cells;
   a case accommodating the battery cells;
   a protective circuit module comprising a circuit board adjacent to the battery cells;
   a temperature sensitive element on the protective circuit module; and
   a flexible printed circuit board being physically spaced from the temperature sensitive element, the flexible printed circuit board comprising a conductive pattern layer, wherein the conductive pattern layer is thermally connected to the temperature sensitive element.

2. The battery pack of claim 1, wherein the circuit board comprises a wiring pattern and wherein the conductive pattern layer directly contacts the wiring pattern of the circuit board.

3. The battery pack of claim 1, wherein the conductive pattern comprises one or more high current lines and one or more sensing lines.

4. The battery pack of claim 3, wherein the flexible printed circuit board further comprises a first connection terminal and a second connection terminal.

5. The battery pack of claim 4, further comprising a conductive tab electrically connecting adjacent ones of the battery cells, wherein the first connection terminal is connected to the conductive tab.

6. The battery pack of claim 4, wherein the circuit board further comprises a connection terminal, and wherein the second connection terminal of the flexible printed circuit board is connected to the connection terminal of the circuit board.

7. The battery pack of claim 4, wherein the first connection terminal is connected to the conductive tab by solder.

8. The battery pack of claim 3, wherein the flexible printed circuit board further comprises a first insulation layer and a second insulation layer, wherein the conductive pattern layer is between the first and second insulation layers.

9. The battery pack of claim 8, wherein a portion of the conductive pattern layer is exposed through the first insulation layer.

10. The battery pack of claim 8, wherein the conductive pattern layer comprises a dummy line connected to the battery cells and configured to transfer heat to the temperature sensitive element.

11. The battery pack of claim 10, wherein the dummy line is electrically independent of the conductive pattern layer.

12. The battery pack of claim 10, wherein the dummy line is electrically insulated from the battery cells.

13. The battery pack of claim 1, wherein a thermally conductive pattern is on the circuit board.

14. The battery pack of claim 13, wherein the thermally conductive pattern is connected to the flexible printed circuit board and configured to transfer heat from the battery cells to the temperature sensitive element.

15. The battery pack of claim 13, wherein the thermally conductive pattern is located between the temperature sensitive element and the flexible printed circuit board.

16. The battery pack of claim 1, wherein the temperature sensitive element is connected to the circuit board by solder.

17. The battery pack of claim 1, wherein the temperature sensitive element is a chip thermistor.

18. The battery pack of claim 1, wherein the temperature sensitive element is a negative temperature coefficient thermistor or a positive temperature coefficient thermistor.

19. The battery pack of claim 1, wherein the conductive pattern layer is adjacent to the battery cells.

20. The battery pack of claim 1, wherein the temperature sensitive element is connected to the flexible printed circuit board by thermal grease or thermal silicon.

* * * * *